United States Patent
Lesso et al.

(10) Patent No.: US 12,167,696 B2
(45) Date of Patent: *Dec. 10, 2024

(54) DRIVER CIRCUITRY

(71) Applicant: Cirrus Logic International Semiconductor Ltd., Edinburgh (GB)

(72) Inventors: John P. Lesso, Edinburgh (GB); Anthony S. Doy, Bend, OR (US)

(73) Assignee: Cirrus Logic Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/410,837

(22) Filed: Jan. 11, 2024

(65) Prior Publication Data
US 2024/0155948 A1    May 9, 2024

Related U.S. Application Data

(63) Continuation of application No. 16/951,032, filed on Nov. 18, 2020, now Pat. No. 11,937,509.

(51) Int. Cl.
*H01L 41/04*    (2006.01)
*B06B 1/02*    (2006.01)
*H10N 30/80*    (2023.01)

(52) U.S. Cl.
CPC ......... *H10N 30/802* (2023.02); *B06B 1/0253* (2013.01); *B06B 2201/55* (2013.01)

(58) Field of Classification Search
CPC .... H01L 41/042; H10N 30/802; B06B 1/0253
USPC .......................................... 310/317
See application file for complete search history.

(56) References Cited

U.S. PATENT DOCUMENTS

| | | |
|---|---|---|
| 2005/0116583 A1 | 6/2005 | Nishio et al. |
| 2007/0046144 A1 | 3/2007 | Urano |
| 2018/0136899 A1 | 5/2018 | Risberg et al. |

FOREIGN PATENT DOCUMENTS

WO    2015143127 A1    9/2015

OTHER PUBLICATIONS

International Search Report and Written Opinion of the International Searching Authority, International Application No. PCT/GB2021/052384, mailed Dec. 13, 2021.

*Primary Examiner* — Derek J Rosenau
(74) *Attorney, Agent, or Firm* — Jackson Walker L.L.P.

(57) ABSTRACT

The present disclosure relates to circuitry for driving a piezoelectric transducer to generate an audio output. The circuitry comprises pre-processor circuitry configured to process an input audio signal to generate a processed signal; driver circuitry coupled to the pre-processor circuitry and configured to generate a drive signal, based on the processed signal, for driving the piezoelectric transducer; and processor circuitry configured to determine a resonant frequency of the piezoelectric transducer. The pre-processor circuitry is configured to process the input audio signal based on the determined resonant frequency so as to generate the processed signal.

20 Claims, 3 Drawing Sheets

DRIVER CIRCUITRY

RELATED APPLICATION

The present disclosure is a continuation of U.S. Non-Provisional patent application Ser. No. 16/951,032, filed Nov. 18, 2020, now U.S. Pat. No. 11,937,509, which is incorporated by reference herein in its entirety.

FIELD OF THE INVENTION

The present disclosure relates to driver circuitry, and in particular to driver circuitry for piezoelectric transducers or other capacitive loads.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

SUMMARY

According to a first aspect, the invention provides circuitry for driving a piezoelectric transducer, the circuitry comprising:
 pre-processor circuitry configured to receive and process an input audio signal to generate a processed version of the input audio signal;
driver circuitry coupled to the pre-processor circuitry and configured to generate a drive signal, based on the processed version of the input audio signal, for driving the piezoelectric transducer to produce an audio output; and
 processor circuitry configured to determine a resonant frequency of the piezoelectric transducer,
 wherein the pre-processor circuitry is configured to process the input audio signal based on the determined resonant frequency so as to generate the processed version of the input audio signal.
 The circuitry may further comprise:
 current monitoring circuitry configured to output a signal indicative of a current through the piezoelectric transducer while the piezoelectric transducer is being driven by the drive signal,
 wherein the processing circuitry is configured to determine the resonant frequency based on the current through the piezoelectric transducer.
 The circuitry may further comprise adaptive filter circuitry configured to receive the processed version of the input audio signal and to output a filter signal, wherein the adaptive filter circuitry is configured to adapt a transfer function thereof based on the signal indicative of the current.
 The circuitry may further comprise error circuitry configured to output an error signal indicative of a difference between the filter signal and the signal indicative of the current, wherein the adaptive filter circuitry is configured to adapt the transfer function based on the error signal.
 The processing circuitry may be configured to determine the resonant frequency of the piezoelectric transducer based on the transfer function of the adaptive filter when a difference between the filter signal and the signal indicative of the current is minimised.

The pre-processing circuitry may be configured to process the input audio signal differently when a frequency of the input audio signal is less than the determined resonant frequency than when the frequency of the input audio signal is greater than the determined resonant frequency.

The pre-processing circuitry may be configured to perform a missing fundamental method on the input audio signal to generate the processed version of the input audio signal when the frequency of the input audio signal is less than the determined resonant frequency, wherein performing the first compression comprises applying a controllable gain to the input audio signal.

The pre-processing circuitry may be configured to perform a first compression on the input audio signal to generate the processed version of the input audio signal when the frequency of the input audio signal is less than the determined resonant frequency.

The pre-processing circuitry may be configured to perform a first equalisation on the input audio signal to generate the processed version of the input audio signal when the frequency of the input audio signal is less than the determined resonant frequency, wherein performing the first equalisation comprises increasing an amplitude of one or more lower-frequency components of the input audio signal and/or reducing an amplitude of one or more higher frequency components of the input audio signal.

The pre-processing circuitry may be configured to perform a first dynamic equalisation on the input audio signal to generate the processed version of the input audio signal when the frequency of the input audio signal is less than the determined resonant frequency, wherein performing the first dynamic equalisation comprises performing a sliding high pass function on the input audio signal.

The pre-processing circuitry may be configured to perform a second compression on the input audio signal to generate the processed version of the input audio signal when the frequency of the input audio signal is greater than the determined resonant frequency, wherein performing the second compression comprises applying a controllable gain to the input audio signal.

The pre-processing circuitry may be configured to perform a second equalisation on the input audio signal to generate the processed version of the input audio signal when the frequency of the input audio signal is greater than the determined resonant frequency, wherein performing the second equalisation comprises increasing an amplitude of one or more lower-frequency components of the input signal and/or reducing an amplitude of one or more higher frequency components of the input signal.

The pre-processing circuitry may be configured to perform a second dynamic equalisation on the input audio signal to generate the processed version of the input audio signal when the frequency of the input audio signal is greater than the determined resonant frequency, wherein performing the second dynamic equalisation comprises performing a sliding high pass function on the input audio signal.

The processing circuitry may be configured to determine the resonant frequency of the piezoelectric transducer during a calibration process for the circuitry. In subsequent use of the circuitry the pre-processing circuitry may be operative to process the input audio signal based on the resonant frequency determined during the calibration process.

The processing circuitry may be configured to determine the resonant frequency continuously or periodically during operation of the circuitry. The pre-processing circuitry may be operative to process the input audio signal based on the resonant frequency determined during operation of the circuitry.

According to a second aspect, the invention provides circuitry for driving a piezoelectric transducer to cause the piezoelectric transducer to produce an audio output, the circuitry comprising:

driver circuitry configured to receive a processed version of an input audio signal received by the circuitry and to generate a drive signal for driving the piezoelectric transducer, wherein the circuitry is configured to determine a resonant frequency of the piezoelectric transducer while it is being driven by the drive signal and to pre-process the input audio signal based on the determined resonant frequency to compensate, at least partially, for a frequency-dependent output characteristic of the piezoelectric transducer.

According to a third aspect, the invention provides circuitry for driving a piezoelectric transducer to cause the piezoelectric transducer to produce an audio output, the circuitry comprising:

current monitor circuitry for monitoring a current through the piezoelectric transducer when the piezoelectric transducer is being driven by a drive signal output by the driver circuitry;

processing circuitry for determining a resonant frequency of the piezoelectric transducer based on the current through the piezoelectric transducer; and pre-processing circuitry configured to generate a processed version of an input audio signal received by the circuitry by applying first processing to the input audio signal if a frequency of the input audio signal is less than the determined resonant frequency and for applying second processing to the input audio signal if the frequency of the input audio signal is greater than the determined resonant frequency, wherein the driver circuitry is configured to generate the drive signal based on the processed version of the input audio signal.

According to a fourth aspect, the invention provides an integrated circuit comprising the circuitry of the first, second or third aspect.

According to a fifth aspect, the invention provides a device comprising the circuitry of the first, second or third aspect.

The device may comprise, for example, a mobile telephone, a tablet or laptop computer, a gaming device, an accessory device, a headset, headphones, earphones, or a smart speaker.

According to a sixth aspect, the invention provides an audio system comprising a piezoelectric transducer for generating an audio output and circuitry according to the first, second or third aspect.

BRIEF DESCRIPTION OF THE DRAWINGS

Embodiments of the invention will now be described, strictly by way of example only, with reference to the accompanying drawings, of which.

DETAILED DESCRIPTION

Figure 1:
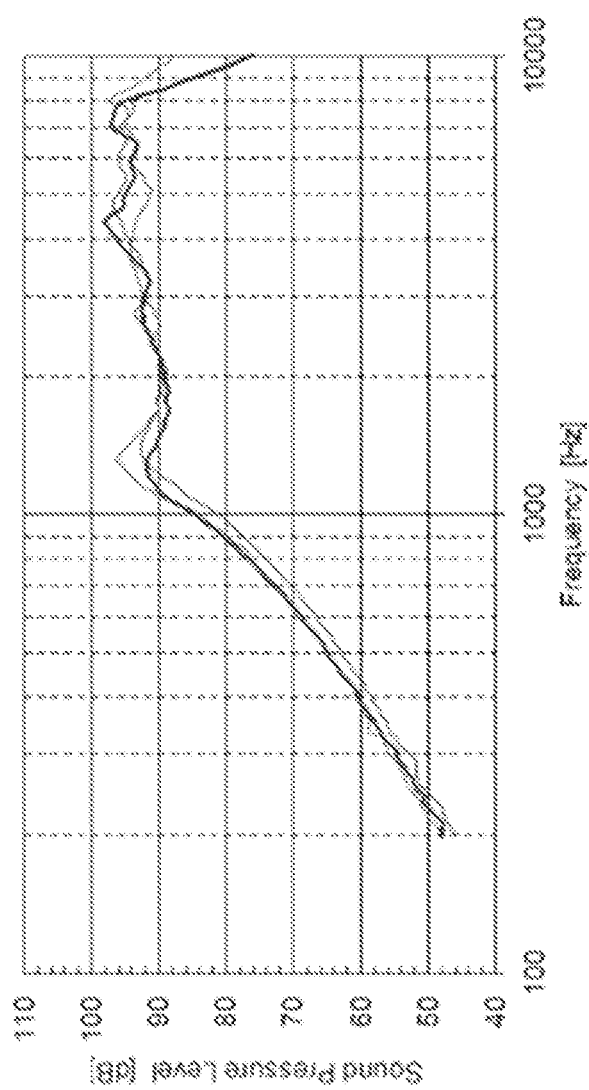
FIG. 1 shows a plot of sound pressure level against frequency for a piezoelectric transducer.

The sound pressure level (SPL) produced by a piezoelectric transducer in response to a drive signal input to the piezoelectric transducer exhibits a broadly high pass behaviour. The SPL produced by a piezoelectric transducer is typically proportional to the square of the frequency f of the drive signal (i.e. $SPL \propto f^2$) up to a particular frequency, and is flatter at frequencies above the particular frequency. A plot of SPL against input signal frequency is shown in FIG. 1.

When driven by a drive signal (e.g. a drive voltage), a piezoelectric transducer acts as a driven damped oscillator, and thus has three regions of operation: stiffness-controlled, resonance-controlled and mass-controlled.

When the frequency of the drive signal is less than a resonant frequency of the piezoelectric transducer, the extent of the displacement of the piezoelectric transducer at any given frequency is governed by a stiffness of the transducer.

When the frequency of the drive signal is equal or close to the resonant frequency of the transducer, the extent of the displacement of the transducer is governed by the amount of damping that the transducer experiences.

When the frequency of the input signal is greater than the resonant frequency of the piezoelectric transducer, the extent of the displacement of the transducer is limited by the inertia of the transducer, in the sense that by the time the transducer starts to move in response to the drive signal, the polarity of the drive signal has changed, and this limits the achievable displacement. This behaviour is known as mass-controlled, since the mass of the transducer limits its achievable motion.

Figure 2:
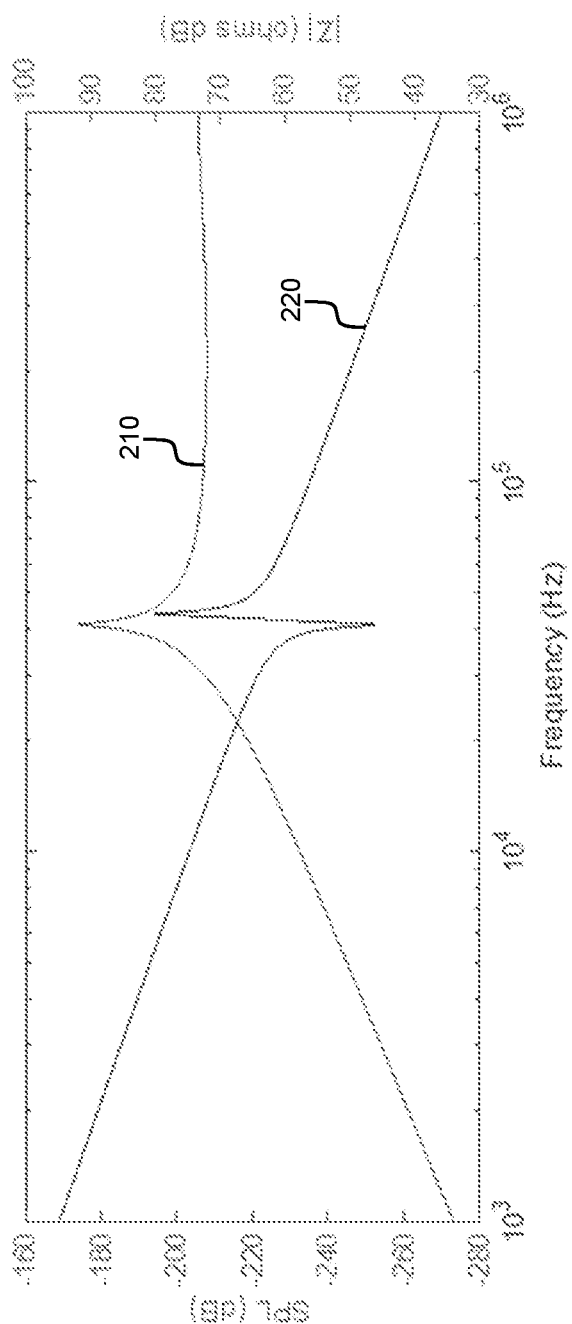
FIG. 2 shows a plot of sound pressure level and impedance against frequency for a piezoelectric transducer.

FIG. 2 is a plot of sound pressure level (trace 210) and impedance (trace 220) against frequency for a typical piezoelectric transducer. As can clearly be seen from FIG. 2, the boundary between stiffness-controlled behaviour of the piezoelectric transducer, in which the output SPL is broadly proportional to the square of the frequency of the input signal, and mass-controlled behaviour of the piezoelectric transducer, in which the output SPL is broadly flat as the frequency of the input signal increases, is delineated by the resonance in the transducer impedance.

The resonant frequency of the piezoelectric transducer is dependent upon the loading of the transducer, and can vary with factors such as temperature, aging and the like. Additionally, piezoelectric transducers are sometimes designed into an enclosure or other speaker fixture, which adds a mechanical mass-spring system to extend the effective SPL in the mass-controlled region of operation. Such an arrangement may also have an effect on the resonant frequency of the transducer.

As will be apparent to those of ordinary skill in the art, in many applications, e.g. audio applications, it is desirable for the sound pressure level of a signal generated by the piezoelectric transducer in response to a drive signal to be substantially uniform across a desired range of drive signal frequencies, and thus it undesirable for the output sound pressure level generated by the piezoelectric transducer to vary according to the frequency of the drive signal.

The present disclosure permits the resonant frequency of a piezoelectric transducer to be estimated or determined during use of the transducer (i.e. when the transducer is being driven by a drive signal). Signal processing techniques can be applied, e.g. to an input signal on which the drive signal is based, to compensate (at least partially) for a frequency dependent output characteristic of the piezoelectric transducer, such as frequency-dependent variations in the sound pressure level output by the piezoelectric transducer in response to drive signals at frequencies above and below the resonant frequency.

Figure 3:
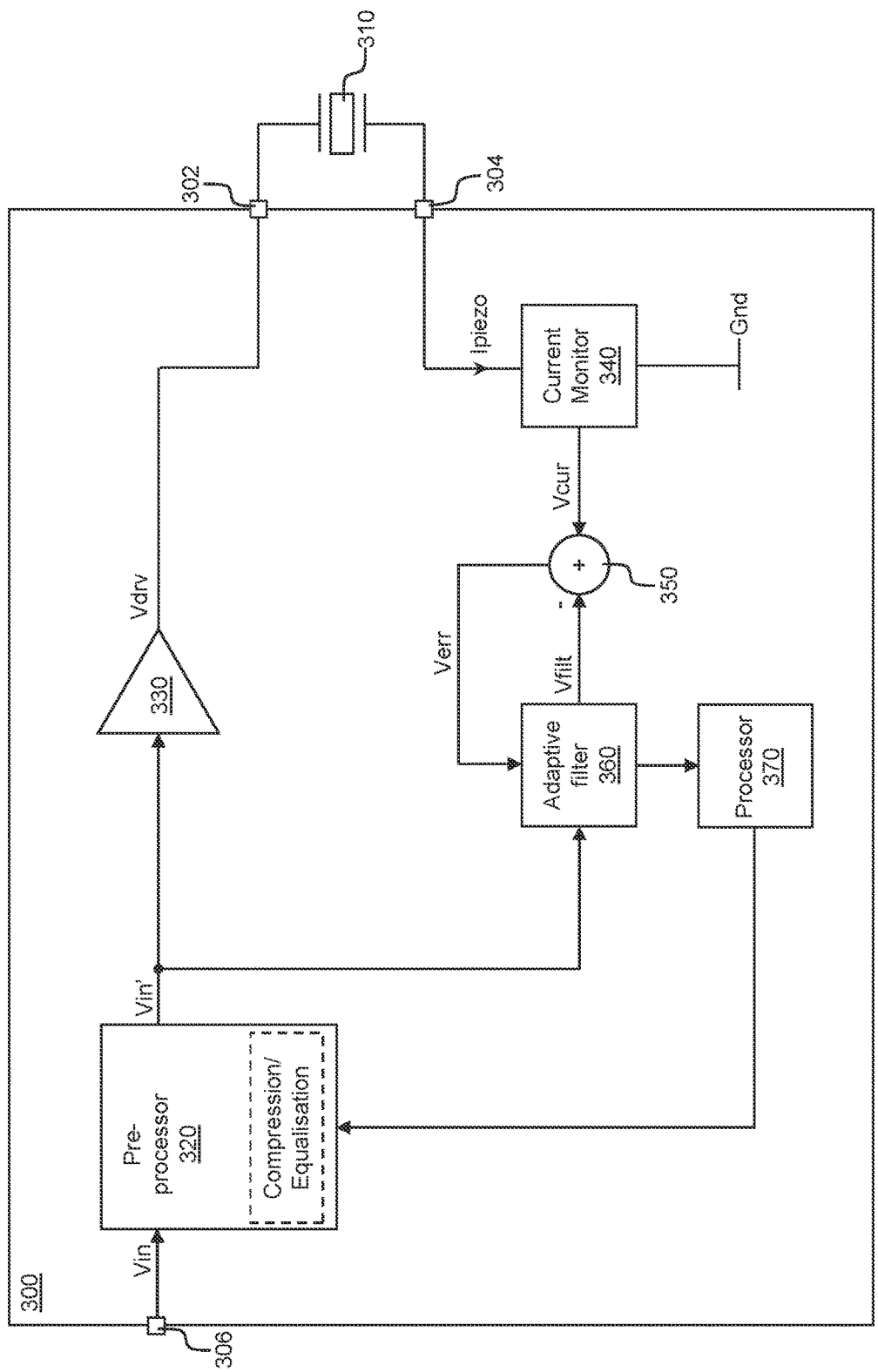
FIG. 3 is a schematic diagram illustrating circuitry for driving a piezoelectric transducer according to the present disclosure.

FIG. 3 is a schematic diagram illustrating example circuitry 300 for driving a piezoelectric transducer 310 according to the present disclosure. The circuitry 300 may be provided or implemented as an integrated circuit. The piezoelectric transducer 310 is typically an off-chip component (i.e. is not part of the integrated circuit) that can be coupled to first and second output nodes (e.g. pins, pads or balls) 302, 304 of the circuitry 300. Alternatively the circuitry 300 may be implemented using discrete circuit components.

The circuitry includes input signal pre-processing circuitry 320 having an input coupled to an input node 306 of the circuitry 300 so as to receive an input signal Vin, which may be, for example, an audio signal. The input signal pre-processing circuitry 320 is configured to process the input signal Vin based on a resonant frequency of the piezoelectric transducer 310, as will be described in more detail below, and to output a processed input signal Vin'.

An output of the input signal pre-processing circuitry is coupled to an input of driver circuitry 330 (e.g. amplifier circuitry), which is configured to generate and output a drive signal Vdrv based on the processed input signal Vin'. The drive signal Vdrv may be, for example, a voltage. An output of the driver circuitry 330 is coupled to the first output node 302, such that, in use of the circuitry 300, the drive signal Vdrv can be supplied to the piezoelectric transducer 310.

The circuitry 300 further includes current monitor circuitry 340 coupled in series between the second output node 304 of the circuitry and a ground or other reference voltage supply rail of the circuitry 300, such that in use of the circuitry 300 the current monitor circuitry is coupled in series with the piezoelectric transducer 310. The current monitor circuitry 340 may comprise, for example, a resistance of known value which is, in use, coupled in series with the piezoelectric transducer 310 and voltage detection circuitry configured to detect a voltage across the resistance.

The current monitor circuitry 340 is configured to generate a signal Vcur (which may be, for example, a voltage) indicative of a current Ipiezo through the piezoelectric transducer 310 when the piezoelectric transducer is being driven by the drive signal Vdrv.

An output of the current monitor circuitry 340 is coupled to a first input of a summing node 350.

The circuitry 300 further includes adaptive filter circuitry 360, having a first input coupled to the output of the input signal pre-processing circuitry 320 and an output coupled to a second input of the summing node 350. The adaptive filter circuitry 360 is configured to receive the processed input signal Vin' which, as will be recalled, is also received by the driver circuitry 330. The adaptive filter circuitry 360 is configured to filter the signal Vin' and to generate a filter output signal Vfilt, which is output to the summing node 350.

The summing node 350 is configured to output an error signal Verr indicative of a difference between the signal Vcur output by the current monitor circuitry 340 and the filter signal Vfilt output by the adaptive filter circuitry 360 (i.e. Verr=Vcur−Vfilt).

The adaptive filter circuitry 360 receives the error signal Verr at a control input thereof, and is configured to adapt its transfer function in response to the error signal Verr so as to minimise the difference between Vcur and Vfilt. When the difference between Vcur and Vfilt is minimised (e.g. when the difference is zero), then the transfer function of the adaptive filter circuitry 360 is approximately the same as an effective transfer function of the combination of the driver circuitry 330 and the piezoelectric transducer 310.

The transfer function of the adaptive filter circuitry 360 when the difference between Vcur and Vfilt is minimised (e.g. when the difference is zero) can be used to characterise or determine the admittance (or equivalently the impedance) of the piezoelectric transducer 310. The resonant frequency of the piezoelectric transducer 310 can be determined or extracted, based on the determined admittance or impedance.

Thus the circuitry 300 further includes processing circuitry 370, coupled to the adaptive filter circuitry 360, and configured to process the transfer function of the adaptive filter circuitry 360 to extract or determine the resonant frequency of the piezoelectric transducer 310. It will be recalled that the resonant frequency of the piezoelectric transducer 310 is not static, but can vary, e.g. according to loading, age, temperature or other factors, and thus the resonant frequency determined by the processing circuitry 370 represents an instantaneous value of the resonant frequency of the piezoelectric transducer 310.

A signal indicative of the extracted or determined resonant frequency is output by the processing circuitry 370 to the input signal pre-processing circuitry 320, which is operative to process the input signal Vin based on the extracted or determined resonant frequency of the piezoelectric transducer 310.

As will be appreciated by those of ordinary skill in the art, the adaptive filter circuitry 360, processing circuitry 370 and input signal pre-processing circuitry 320 may all be implemented as single digital signal processor (DSP) circuit or block. Alternatively the adaptive filter circuitry 360, processing circuitry 370 and input signal pre-processing circuitry 320 may be implemented as separate blocks or subsystems of digital or analogue circuitry, and may be implemented in integrated circuitry (e.g. as part of an integrated circuit implementation of the circuitry 300) or as discrete circuitry (e.g. using discrete components mounted on a printed circuit board or other suitable substrate).

The input signal pre-processing circuitry 320 is configured to compare a frequency of the input signal Vin to the extracted resonant frequency of the piezoelectric transducer 310 and to apply different signal processing to the input signal Vin depending on whether the frequency of the input signal Vin is greater than or less than the determined or extracted resonant frequency. Thus the input signal pre-processing circuitry 320 may apply first processing to the input signal Vin if the frequency of the input signal is less than the determined resonant frequency, and may apply second processing to the input signal if the frequency of the input signal is greater than the determined resonant frequency.

The frequency of the input signal Vin may be known, e.g. from information provided to the input signal pre-processing circuitry 320, or alternatively, the input signal pre-processing circuitry 320 may be configured to measure or otherwise determine the frequency of the input signal Vin.

For input signals whose frequency is less than the resonant frequency of the piezoelectric transducer 310, the input signal pre-processing circuitry 320 may perform signal processing on the input signal to compensate, at least partially, for frequency-dependent variations in the output sound pressure level of the piezoelectric transducer 310.

For example, the input signal pre-processing circuitry 320 may be configured to perform or apply processing to add synthesised harmonic frequency components of a fundamental frequency component to the input signal Vin (and possibly also to suppress a frequency component at the fundamental frequency that is present in the input signal Vin). Thus the input signal processing circuitry 370 may be configured to apply a "missing fundamental" method to the input signal. This has the effect of reducing the lower-frequency content of the input signal Vin, thus mitigating the effect of the non-uniform relationship between input signal frequency and output SPL of the piezoelectric transducer 310, whilst still allowing a listener to perceive the presence of the missing fundamental frequency component in an audible signal output by the piezoelectric transducer.

Additionally or alternatively, the input signal pre-processing circuitry 320 may be configured to perform audio compression on the input signal Vin, by applying a controllable gain to the input signal Vin to adjust its signal level, e.g. by reducing the level of portions of the input signal Vin that exceed a threshold.

The input signal pre-processing circuitry 320 may additionally or alternatively be configured to perform equalisation on the input signal Vin, e.g. by increasing the amplitude of lower frequency components of the input signal Vin and/or reducing the amplitude of higher frequency components of the input signal Vin, thereby at least partially compensating for the frequency-dependent variations in the SPL of a signal produced by the piezoelectric transducer 310.

The input signal pre-processing circuitry 320 may additionally or alternatively be configured to perform a dynamic equalisation function such as a sliding high pass on the input signal Vin.

For input signals whose frequency is greater than the resonant frequency of the piezoelectric transducer 310, the input signal pre-processing circuitry 320 may perform different signal processing on the input signal Vin to compensate, at least partially, for less pronounced frequency-dependent effects on the output sound pressure level of the signal produced by piezoelectric transducer 310.

Thus, for example, the input signal pre-processing circuitry 320 may be configured to perform audio compression on the input signal Vin, using a different threshold than the threshold used when processing input signals at lower frequencies than the resonant frequency of the piezoelectric transducer 310.

Additionally or alternatively, the input signal pre-processing circuitry 320 be configured to perform equalisation on the input signal Vin. Again, the equalisation function performed on input signals at frequencies that are greater than the resonant frequency of the piezoelectric transducer 310 will differ from the equalisation function performed on input signals at frequencies lower than the resonant frequency. For example, where the input signal is at a higher frequency than the resonant frequency, the input signal pre-processing circuitry 320 may be configured to perform equalisation by performing a simple low-pass filtering operation on the input signal Vin.

The input signal pre-processing circuitry 320 may additionally or alternatively be configured to perform a different dynamic equalisation function (e.g. a sliding low pass) on input signals at frequencies greater than the resonant frequency than is used for input signals as frequencies that are less than the resonant frequency.

The circuitry 300 may be operative to determine the processing to be performed on the input signal Vin by the input signal pre-processing circuitry 320 during an initial or periodic calibration procedure in which, for example, a test signal is output to the piezoelectric transducer 310 to determine its resonant frequency as described above.

Such a calibration procedure may be performed, for example, during production test of a host device incorporating the circuitry 300 and a piezoelectric transducer 310, and/or may be performed periodically during operation of the host device, e.g. each time the host device is switched on.

Alternatively, the circuitry 300 may be operative to monitor the resonant frequency of the piezoelectric transducer 310 continuously during operation of the circuitry 300, and to dynamically adapt the processing performed on the input signal Vin by the input signal pre-processing circuitry 320 based on the resonant frequency.

As will be apparent from the foregoing description, the present disclosure provides a system which improves the acoustic performance of a piezoelectric transducer, by pre-processing an input signal that is used to generate a drive signal for driving the transducer so as to compensate, at least partially, for a frequency-dependent output characteristic of the piezoelectric transducer, e.g. frequency-dependent variations in the output sound pressure level of an acoustic signal produced by the piezoelectric transducer in response to the drive signal. By determining, estimating or inferring an instantaneous resonant frequency of the piezoelectric transducer 310, a mode of operation (e.g. stiffness-controlled or mass-controlled) of the piezoelectric transducer 310 for a given input signal can be determined, and appropriate processing can be performed on the input signal to reduce or compensate for the effects of frequency-dependent variations in the output acoustic signal produced by the transducer.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)

programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a piezoelectric transducer, the circuitry comprising:
   pre-processor circuitry configured to receive and process an input audio signal to generate a processed version of the input audio signal;
   driver circuitry coupled to the pre-processor circuitry and configured to generate a drive signal, based on the processed version of the input audio signal, for driving the piezoelectric transducer to produce an audio output; and
   processor circuitry configured to determine a resonant frequency of the piezoelectric transducer,
   wherein the pre-processor circuitry is configured to process the input audio signal based on the determined resonant frequency so as to generate the processed version of the input audio signal.

2. Circuitry according to claim 1, further comprising:
   current monitoring circuitry configured to output a signal indicative of a current through the piezoelectric transducer while the piezoelectric transducer is being driven by the drive signal,
   wherein the processing circuitry is configured to determine the resonant frequency based on the current through the piezoelectric transducer.

3. Circuitry according to claim 2, further comprising adaptive filter circuitry configured to receive the processed version of the input audio signal and to output a filter signal, wherein the adaptive filter circuitry is configured to adapt a transfer function thereof based on the signal indicative of the current.

4. Circuitry according to claim 3, further comprising error circuitry configured to output an error signal indicative of a difference between the filter signal and the signal indicative of the current, wherein the adaptive filter circuitry is configured to adapt the transfer function based on the error signal.

5. Circuitry according to claim 4, wherein the processing circuitry is configured to determine the resonant frequency of the piezoelectric transducer based on the transfer function of the adaptive filter when a difference between the filter signal and the signal indicative of the current is minimised.

6. Circuitry according to claim 1 wherein the pre-processing circuitry is configured to process the input audio signal differently when a frequency of the input audio signal is less than the determined resonant frequency than when the frequency of the input audio signal is greater than the determined resonant frequency.

7. Circuitry according to claim 6 wherein the pre-processing circuitry is configured to perform a missing fundamental method on the input signal to generate the processed version of the input audio signal when the frequency of the input signal is less than the determined resonant frequency.

8. Circuitry according to claim 6 wherein the pre-processing circuitry is configured to perform a first compression on the input audio signal to generate the processed version of the input audio signal when the frequency of the input audio signal is less than the determined resonant frequency, wherein performing the first compression comprises applying a controllable gain to the input audio signal.

9. Circuitry according to claim 6 wherein the pre-processing circuitry is configured to perform a first equalisation on the input audio signal to generate the processed version of the input audio signal when the frequency of the input audio signal is less than the determined resonant frequency, wherein performing the first equalisation comprises increasing an amplitude of one or more lower-frequency components of the input audio signal and/or reducing an amplitude of one or more higher frequency components of the input audio signal.

10. Circuitry according to claim 6 wherein the pre-processing circuitry is configured to perform a first dynamic equalisation on the input audio signal to generate the processed version of the input audio signal when the frequency of the input audio signal is less than the determined resonant frequency, wherein performing the first dynamic equalisation comprises performing a sliding high pass function on the input audio signal.

11. Circuitry according to claim 6 wherein the pre-processing circuitry is configured to perform a second compression on the input audio signal to generate the processed version of the input audio signal when the frequency of the input audio signal is greater than the determined resonant frequency, wherein performing the second compression comprises applying a controllable gain to the input audio signal.

12. Circuitry according to claim 6 wherein the pre-processing circuitry is configured to perform a second equalisation on the input audio signal to generate the processed version of the input audio signal when the frequency of the input audio signal is greater than the determined resonant frequency, wherein performing the second equalisation comprises increasing an amplitude of one or more lower-frequency components of the input signal and/or reducing an amplitude of one or more higher frequency components of the input signal.

13. Circuitry according to claim 6 wherein the pre-processing circuitry is configured to perform a second dynamic equalisation on the input audio signal to generate the processed version of the input audio signal when the frequency of the input audio signal is greater than the determined resonant frequency, wherein performing the second dynamic equalisation comprises performing a sliding high pass function on the input audio signal.

14. Circuitry according to claim 1 wherein the processing circuitry is configured to determine the resonant frequency of the piezoelectric transducer during a calibration process for the circuitry, wherein in subsequent use of the circuitry the pre-processing circuitry is operative to process the input audio signal based on the resonant frequency determined during the calibration process.

15. Circuitry according to claim 1 wherein the processing circuitry is configured to determine the resonant frequency continuously or periodically during operation of the circuitry, and wherein the pre-processing circuitry is operative to process the input audio signal based on the resonant frequency determined during operation of the circuitry.

16. An integrated circuit comprising the circuitry of claim 1.

17. A device comprising the circuitry of claim 1, wherein the device comprises a mobile telephone, a tablet or laptop computer, a gaming device, an accessory device, a headset, headphones, earphones, or a smart speaker.

18. An audio system comprising a piezoelectric transducer for generating the audio output and the circuitry according to claim 1.

19. Circuitry for driving a piezoelectric transducer to cause the piezoelectric transducer to produce an audio output, the circuitry comprising:
driver circuitry configured to receive a processed version of an input audio signal received by the circuitry and to generate a drive signal for driving the piezoelectric transducer based on the processed version of the input audio signal,
wherein the circuitry is configured to determine a resonant frequency of the piezoelectric transducer while it is being driven by the drive signal and to pre-process the input audio signal based on the determined resonant frequency to compensate, at least partially, for a frequency-dependent output characteristic of the piezoelectric transducer.

20. Circuitry for driving a piezoelectric transducer to cause the piezoelectric transducer to produce an audio output, the circuitry comprising:
current monitor circuitry for monitoring a current through the piezoelectric transducer when the piezoelectric transducer is being driven by a drive signal output by a driver circuitry;
processing circuitry for determining a resonant frequency of the piezoelectric transducer based on the current through the piezoelectric transducer; and
pre-processing circuitry configured to generate a processed version of an input audio signal received by the circuitry by applying first processing to the input audio signal if a frequency of the input audio signal is less than the determined resonant frequency and for applying second processing to the input signal if the frequency of the input audio signal is greater than the determined resonant frequency,
wherein the driver circuitry is configured to generate the drive signal based on the processed version of the input audio signal.

* * * * *